United States Patent [19]

Kawamura

[11] Patent Number: 5,116,768

[45] Date of Patent: May 26, 1992

[54] FABRICATION METHOD OF A SEMICONDUCTOR INTEGRATED CIRCUIT HAVING AN SOI DEVICE AND A BULK SEMICONDUCTOR DEVICE ON A COMMON SEMICONDUCTOR SUBSTRATE

[75] Inventor: Seiichiro Kawamura, Tokyo, Japan

[73] Assignee: Fujitsu Limited, Kawasaki, Japan

[21] Appl. No.: 496,031

[22] Filed: Mar. 20, 1990

[30] Foreign Application Priority Data

Mar. 20, 1989 [JP] Japan .................................. 1-68073

[51] Int. Cl.$^5$ ............................................ H01L 21/205
[52] U.S. Cl. ........................................ 437/21; 437/69; 437/83; 437/233
[58] Field of Search ............... 437/83, 21, 233, 69; 357/23.7

[56] References Cited

U.S. PATENT DOCUMENTS 4,768,076 8/1988 Aoki ...................................... 437/83

FOREIGN PATENT DOCUMENTS 0014371 2/1977 Japan .................................. 437/69
14526 of 1983 Japan .
0025271 2/1983 Japan .................................. 437/21
0175853 10/1983 Japan .............................. 357/23.7

Primary Examiner—Olik Chaudhuri
Assistant Examiner—Ourmazd S. Ojan
Attorney, Agent, or Firm—Staas & Halsey

[57] ABSTRACT

A method of fabricating a semiconductor integrated circuit carrying a first type semiconductor device wherein at least a part thereof is formed within a substrate and a second type semiconductor device which is provided on an oxide layer formed on the substrate, comprises steps of providing a silicon nitride film on the substrate selectively in correspondence to where the first type semiconductor device is to be formed, oxidizing the substrate using the silicon nitride film as an oxidation resistant mask to form an oxide layer in correspondence to where the substrate is not covered by the silicon nitride film, depositing a silicon layer on the substrate so as to bury thereunder the silicon nitride film and the oxide layer, annealing the silicon layer such that the silicon layer is caused to melt and crystallized subsequently to form a single crystal silicon layer, and patterning the single crystal silicon layer such that the single crystal silicon layer is removed except for a part thereof covering a region of the oxide layer where the second type semiconductor device is to be provided, wherein the step of patterning is performed such that the silicon nitride film is removed simultaneously to the removal of the single crystal silicon layer.

6 Claims, 4 Drawing Sheets (PRIOR ART)

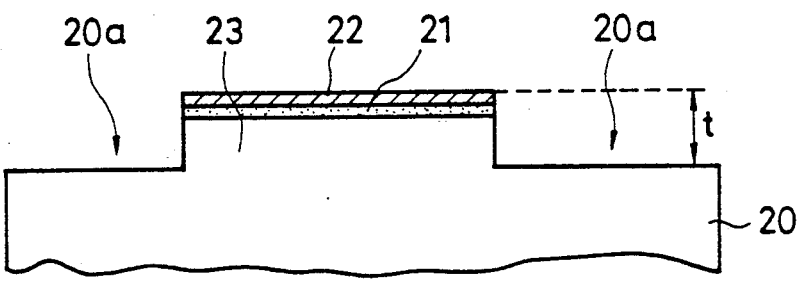
F I G. 5A
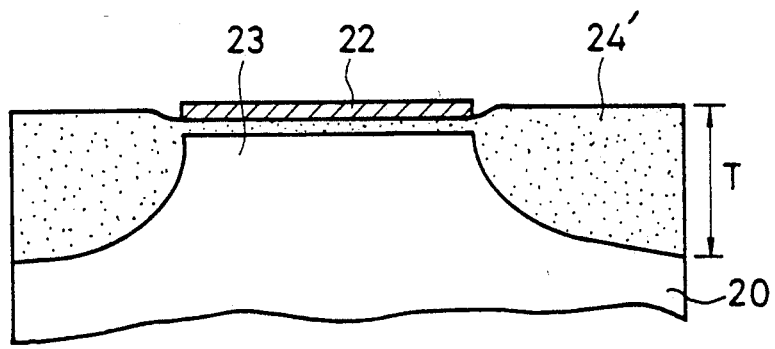
F I G. 5B

FABRICATION METHOD OF A SEMICONDUCTOR INTEGRATED CIRCUIT HAVING AN SOI DEVICE AND A BULK SEMICONDUCTOR DEVICE ON A COMMON SEMICONDUCTOR SUBSTRATE

BACKGROUND OF THE INVENTION

The present invention generally relates to semiconductor devices, and in particular to a fabrication method of a semiconductor integrated circuit on a semiconductor substrate such that a first type device having a so-called semiconductor-on-insulator (SOI) structure wherein the device is provided on an insulator layer formed on the substrate, and a second type device or bulk semiconductor device wherein a substantial part thereof is formed within the substrate, are formed commonly on the same substrate.

Recently, there is a demand for high voltage integrated circuits used for display drivers. Such a high voltage integrated circuit is usually fabricated in the SOI structure in order to achieve a high breakdown voltage, as the conventional bulk structure devices, fabricated such that a substantial part thereof, such as the source and drain regions, are formed within the substrate by ion implantation and the like, are incapable of operating under high voltage environments unless a complicated isolation structure is formed within the substrate.

In particular, in the integrated circuits used for display drivers and the like, it is usual that the logic circuit part, to which no substantial high voltage is applied, is formed to have the bulk device structure using the well established fabrication process, and only the output part to which the high voltage is applied is formed on a field oxide region, in a form of the SOI structure.

FIG. 1 shows a typical conventional integrated circuit wherein a first type semiconductor device having the SOI structure and a second type semiconductor device having the bulk structure, are provided on a common substrate 1.

Referring to FIG. 1, the substrate 1 is provided with a usual field oxide region 2 of silicon oxide for device isolation, and a high voltage MOSFET device 3 is provided on the field oxide region 2. Further, a logic device 4 which may be a CMOSFET device driven at a low voltage such as 5 volts, is provided on the substrate 1 in correspondence to the device region defined by the field oxide region 2.

FIGS. 2A-2E show the conventional process of fabricating the semiconductor device of FIG. 1.

Referring to the drawings, in a step of FIG. 2A, a thin silicon oxide film 11 is formed on the silicon substrate 1 by thermal oxidation for a thickness of about 500 Å. Further, a silicon nitride ($Si_3N_4$) film 12 is provided on the silicon oxide film 11 for a thickness of about 1000 Å by a reduced pressure chemical vapor deposition (LPCVD) process. Further, the silicon oxide film 11 and the silicon nitride film 12 are patterned photolithographically to leave an oxidation resistant mask on the substrate 1 in correspondence to a device region 13 where a bulk semiconductor device such as the device 4 is to be formed. The silicon oxide film 11 under the silicon nitride film 12 acts as a buffer layer for relaxing the mechanical stress, which otherwise would be applied to the substrate 1 by the silicon nitride film 12 when the silicon oxide film 11 is omitted.

In a step of FIG. 2B, the substrate 1 thus obtained is subjected to a thermal oxidation process in a wet oxygen atmosphere at about 900° C., whereby the field oxide region 2 is formed on the exposed part of the silicon substrate 1 for a thickness of about 1 um. This part of the process is well known as the LOCOS process.

In a step of FIG. 2C, the silicon nitride film 12 is removed by etching using a solution of phosphoric acid, and a polysilicon layer 5 is provided on the entire surface of the substrate 1 which is now covered by the field oxide region 2 as well as by the silicon oxide film 11, for a thickness of bout 0.5 μm by the LPCVD process. Alternatively, a layer of non-crystalline silicon such as an amorphous silicon film may be used in place of the polysilicon layer 5.

In a step of FIG. 3D, the polysilicon layer 5 is irradiated by an energy beam such as a laser beam produced by a continuous oscillation of Ar-laser, and thereby the polysilicon layer 5 is crystallized to form a single crystal silicon layer 5'. In other words, a beam annealing process is performed in the step of FIG. 3D.

Next, in a step of FIG. 3E, the single crystal silicon layer 5' is removed by an isotropic dry etching process except for a device region 14 where an SOI device such as the device 3 is to be formed.

Further, in a step not illustrated, the bulk semiconductor device such as the device 4 and the SOI device such as the device 3 are provided respectively in correspondence to the device region 13 and the device region 14, and thereby a structure similar to the one described with reference to FIG. 1 is obtained. As already described, the SOI device 3 provided on the recrystallized single crystal silicon region 5' is insulated from the substrate 1 by the thick field oxide region 2, and can withstand a high voltage.

In such a conventional process of fabricating the semiconductor device, it is known that a problem arises in the step of beam annealing of FIG. 2D, such that a rupture occurs in the molten silicon layer 5' when the beam annealing condition, such as the beam energy, scanning speed and the like, is deviated even slightly from an optimum condition. FIG. 3 shows a typical example of the rupture occured in the re-crystallized silicon layer 5'. As will be seen from the drawing, there appears a thickened region in the layer 5' as a result of the rupture, and such a thickened region remains throughout various processes performed subsequently. Thereby, various undesirable effects are caused in the process and in the device characteristic.

Although the reason of this rupture, occurring at the time of beam annealing, is not fully explored, it is thought probable that the difference in the thermal conductivity between the device region 13 where the silicon layer 5' is contacted directly to the silicon substrate 1 and the device region 14 where the silicon layer 5' is separated from the substrate 1 by the field oxide region 2, causes a difference in the cooling rate at the time of crystallization of the molten silicon, and this difference in the rate of crystallization contributes to this rupture of the silicon layer 5' in some way.

On the other hand, it is known conventionally that silicon nitride shows an excellent wetting to molten silicon. Thus, there has been proposals, for example as disclosed in the Japanese Laid-open Patent Application No.58-14526, to provide an intervening silicon nitride layer between a silicon oxide layer and a silicon layer deposited thereon in a form of molten silicon layer to improve the process of forming a structure in which the silicon layer is provided on the silicon oxide layer. However, the foregoing process disclosed in the Japanese Laid-open Patent Application No. 58-14526 is not directed to the fabrication process of the semiconductor integrated circuits having both the bulk semiconductor devices and the SOI devices, and requires an extra step for providing the silicon nitride layer at the time of fabrication of the semiconductor device only for the purpose of improving the wetting, and the silicon nitride layer thus provided remains unnecessarily after the process of device fabrication is completed.

SUMMARY OF THE INVENTION

Accordingly, it is a general object of the present invention to provide a novel and useful method of fabricating a semiconductor integrated circuit, wherein the foregoing problems are eliminated.

Another object of the present invention is to provide a method of fabricating a semiconductor integrated circuit including a bulk semiconductor device formed directly on a substrate in correspondence to a device region defined by a field oxide structure, and an SOI device provided on the field oxide structure defining the device region, comprising steps of providing a silicon nitride film selectively on the substrate in correspondence to the device region so as to eliminate oxidation of the silicon substrate underneath the silicon nitride film, oxidizing the silicon substrate except for the device region covered by the silicon nitride film to form the field oxide region, providing a silicon layer on the substrate so as to bury the silicon nitride film and the field oxide region, and annealing the silicon layer by melting and re-crystallizing the silicon layer to form a single crystal silicon layer, and patterning the single crystal silicon layer such that the single crystal silicon layer remains only on the field oxide layer in correspondence to where the SOI device is to be provided, wherein the step of patterning the single crystal silicon layer is performed such that the silicon nitride film is removed simultaneously to the patterning. According to the present invention, the problem of rupture of the molten silicon layer at the time of annealing is eliminated by leaving the silicon nitride film, which shows the excellent wetting to the molten silicon, during the steps of providing and annealing the silicon layer. Note that this silicon nitride film is the one which has been conventionally used as the mask for preventing the oxidation of the device region of the substrate, and no extra step is introduced for provision of the silicon nitride film. Further, this silicon nitride film is removed simultaneously to the patterning of the single crystal silicon layer. This simultaneous removal becomes possible because silicon nitride has an etching rate which is substantially identical to the etching rate of silicon. Again, no extra step is used for removing the silicon nitride film. Rather, the separate step used in the conventional fabrication process to remove the silicon nitride film is eliminated in the process of the present invention.

Other objects and further features of the present invention will become apparent from the following detailed description when read in conjunction with attached drawings.

BRIEF DESCRIPTION OF THE DRAWINGS

FIG. 5 is a cross sectional view showing another embodiment of the present invention.

DETAILED DESCRIPTION

FIGS. 4A-4E are diagrams showing the steps for fabricating the semiconductor integrated circuit according to a first embodiment of the present invention.

Figure 4A:
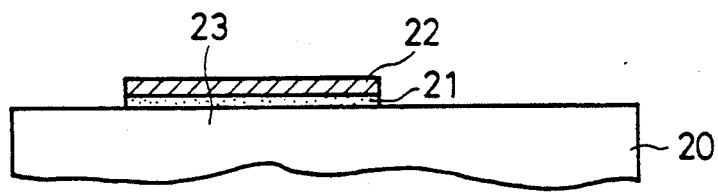
FIGS. 4A-4E are cross-sectional views showing various steps of fabricating the integrated circuit of FIG. 1 according to an embodiment of the present invention.

In a step of FIG. 4A, a silicon substrate 20 is subjected to a thermal oxidation, whereby a silicon oxide film 11 is formed thereon for a thickness of about 500 Å. Next, a silicon nitride film 22 is deposited on the silicon oxide film 11 by the LPCVD process for a thickness of about 1000 Å as an oxidation resistant mask. Next, the silicon nitride film 22 and the silicon oxide film 21 underneath are patterned photolithographically, such that the silicon nitride film 22 and the silicon oxide film 21 are left on a device region 23 of the substrate 20 on which a bulk semiconductor device is to be formed. Here, the silicon oxide film 11 acts as a buffer layer for relaxing the stress which otherwise would develop as a result of direct formation of the silicon nitride film 22 on the silicon substrate 20.

Figure 1:
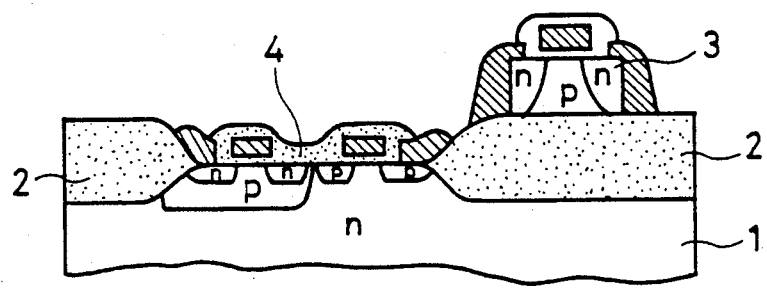
FIG. 1 is a cross-sectional view showing a typical example of an integrated circuit wherein a bulk semiconductor device and an SOI device are provided on a common substrate.
Figure 3:
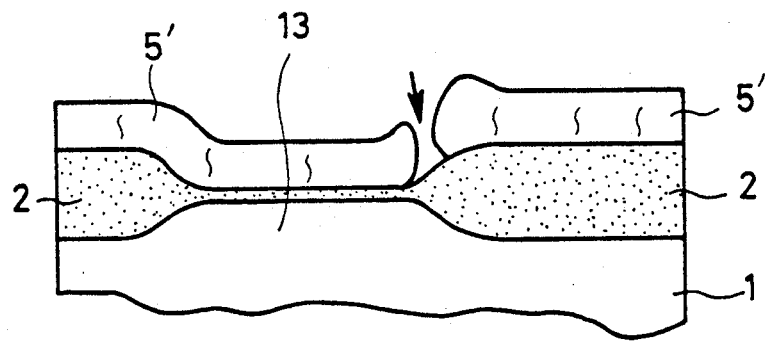
FIG. 3 is a cross-sectional view showing a problem pertinent to the conventional fabrication process of FIGS. 2A-2E.
Figure 2A:
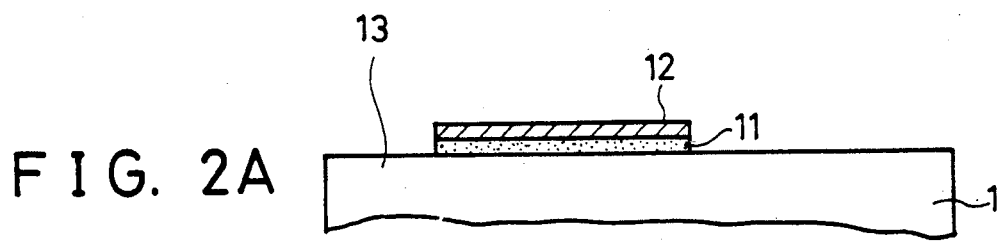
FIGS. 2A-2E are cross-sectional views showing various steps for fabricating the integrated circuit of FIG. 1 according to a conventional process.
Figure 2B:
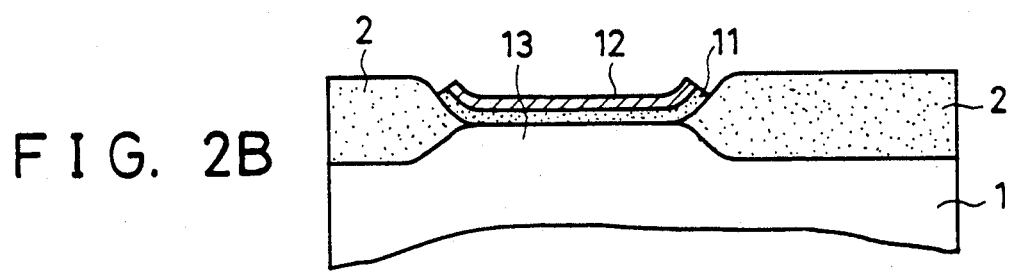
Figure 4B:
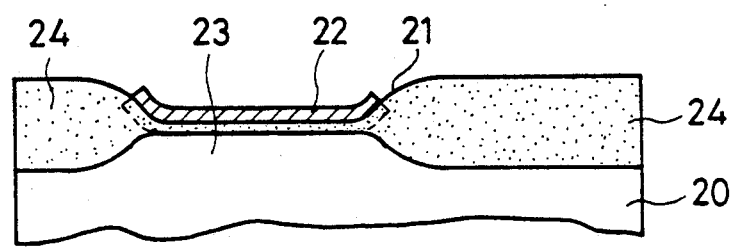

In a step of FIG. 4B, the structure of FIG. 1A is heat treated in an atmosphere containing wet oxygen at about 900° C. Thereby, a thick field oxide region of silicon oxide is formed on the exposed surface of the substrate 20 for a thickness of about 1 μm. This process is identical to the conventional LOCOS process used in the step of FIG. 2B.

Figure 2C:
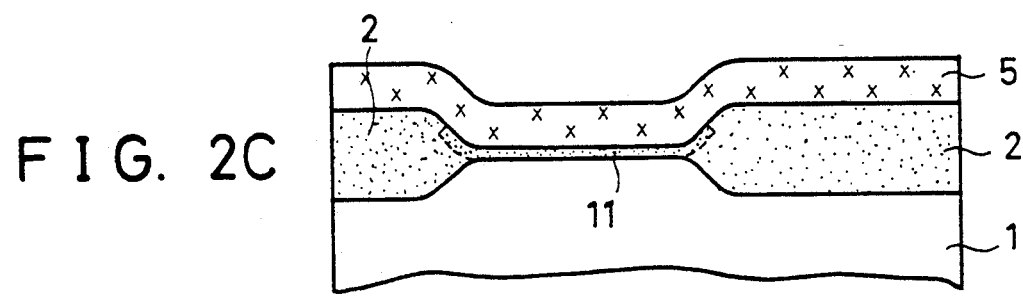
Figure 2D:
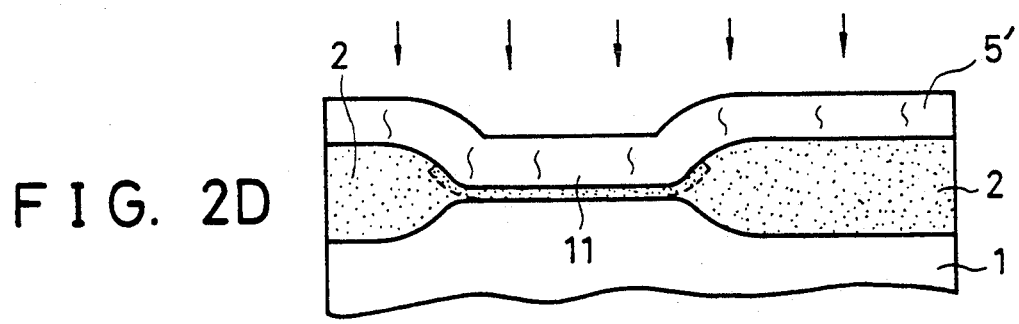
Figure 2E:
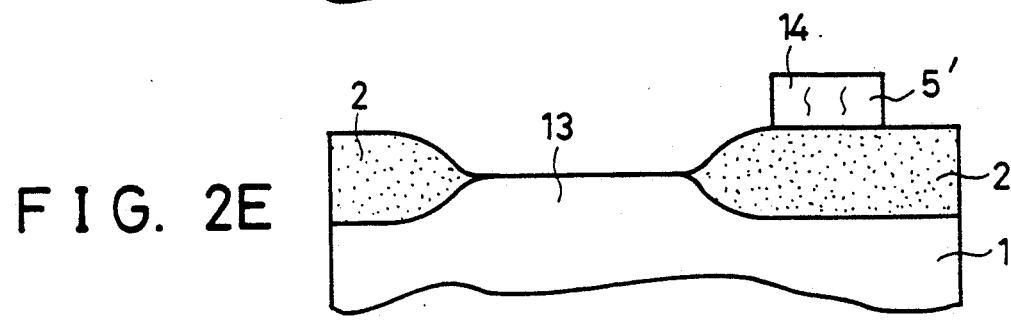
Figure 4C:
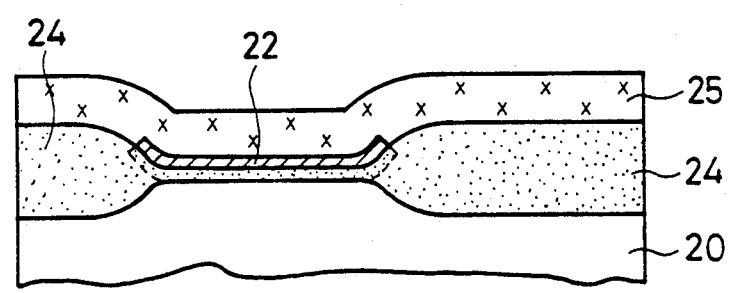

In a step of FIG. 4C, the silicon nitride film 22 is not removed but left as it is, in contrast to the conventional process of FIG. 2C, and a polysilicon layer 25 is deposited uniformly on the substrate 20 by the LPCVD process for a thickness of about 0.5 μm such that the silicon nitride film 22 and the field oxide structure 24 are buried under the polysilicon layer 25.

Figure 4D:
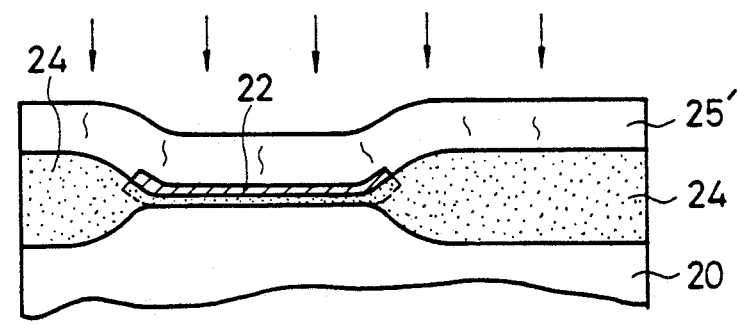

In a step of FIG. 4D, a laser beam generated for example by a continuous oscillation of argon laser is irradiated on the polysilicon layer 25, and thereby melting is caused in the polysilicon layer 25. The laser beam used for this purpose may for example have an energy of about 5 -6 watts, and is scanned over the surface of the polysilicon layer 25 with a scanning speed of about 150 mm/sec. During the foregoing process, the substrate 20 is held at a temperature of about 500° C., and the melting occurs with a lateral extension of about 20-30 microns. As a result of melting and subsequent cooling, the polysilicon layer 25 is recrystallized into a single crystal silicon layer 25'.

Figure 4E:
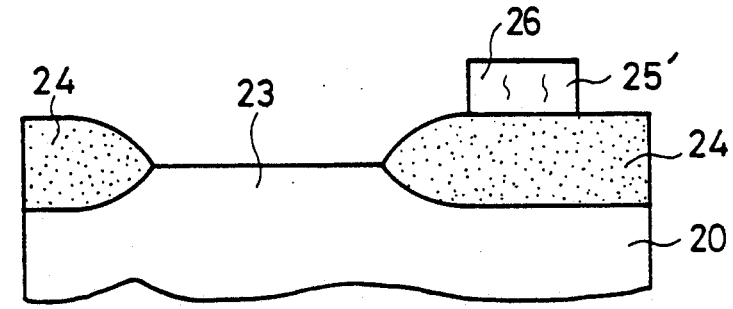

In a next step of FIG. 4E, the single crystal silicon layer 25' is patterned whereby a substantial part of the single crystal silicon layer 25' is removed together with the silicon nitride film 22 by an isotropic dry etching process, leaving the layer 25'only in correspondence to a device region 26 where an SOI device is to be formed. In this dry etching process, the silicon nitride film 22 is removed with an etching rate which is substantially identical to the etching rate of the single crystal silicon, and thus, the etching is controlled exactly such that a flat top surface of the silicon substrate 20 is exposed at the device region 23.

According to such a fabrication method, an excellent wetting is obtained at the boundary between the silicon nitride film 22 and the molten silicon layer 25' at the time of annealing, and the problem of rupture of the silicon layer 25' which tends to occur in this region in the conventional process is successfully eliminated. The elimination of the problem is further facilitated by the contribution of finite layer thickness of the silicon nitride film 22 remaining in the device region 23 and acting somewhat like a bird's beak structure. Note that the existence of such a silicon nitride film 22 contributes to the diminishing of the step height formed or the surface of the substrate 20 at the time of formation of the field oxide structure 24, and as a result of the diminishing of the step height, the risk that the silicon layer 25' is ruptured at the time of beam annealing is substantially reduced.

FIGS. 5A and 5B show a second embodiment of the present invention. As the substantial part of the steps of this embodiment is identical to the case of the first embodiment, only the steps which are different from those of the first embodiment will be described.

In a step of FIG. 5A, the substrate 20 is provided with grooves 20a at both sides of the device region 23 for a depth t which is about one-half of the thickness T of a field oxide structure 24'(FIG. 5B) to be formed.

Next, in a step of FIG. 5B, the structure of FIG. 5A is subjected to oxidation in the wet oxygen atmosphere, whereby the field oxide structure 24' is formed in correspondence to the grooves 20a. As the field oxide structure 24' is formed on the grooves 20a which is depressed with respect to the substrate surface at the device region 23, the field oxide structure 24' forms a surface which is substantially flush to the surface of the silicon nitride film 22, and the subsequent process of deposition and beam annealing of a polysilicon layer corresponding to the step of FIG. 4D of the first embodiment is performed with increased reliability.

After the deposition and beam annealing of the polysilicon layer, the single crystal silicon layer is formed similarly to the case of the first embodiment, and a device region for the SOI device is patterned similarly to the step of FIG. 4E. As these steps are substantially identical to the steps of FIGS. 4D and 4E, illustration and description thereof will be omitted.

Further, the present invention is not limited to these embodiments but various variations and modifications may be made within the scope of the present invention.

What is claimed is:

1. A method of fabricating a semiconductor integrated circuit carrying a first type semiconductor device wherein at least a part thereof is formed within a substrate and a second type semiconductor device which is provided on an oxide layer formed on the substrate, comprising the steps of:
    a) providing a silicon oxide film on the substrate selective in correspondence to where the first type semiconductor device is to be formed, the silicon oxide film having an upper major surface at a first level;
    b) producing a silicon nitride film on the silicon oxide film;
    c) oxidizing the substrate using the silicon nitride film as an oxidation resistant mask to form an oxide layer in correspondence to where the substrate is not covered by the silicon nitride film, the oxide layer having an upper major surface at a second level that is higher than the first level, the oxide layer forming a birds beak structure at a boundary between the oxide layer and the oxide film, the birds beak structure having a declining upper major surface that declines toward the oxide film and continues declining toward the upper major surface of the oxide film, the oxide layer having the silicon nitride film extending over a limited portion of the declining upper major surface of the birds beak structure;
    d) depositing a silicon layer on the substrate extending continuously over the silicon nitride film and the oxide layer to bury thereunder the silicon nitride film and the oxide layer;
    e) annealing the silicon layer such that the silicon layer melts and crystallizes prior to forming a single crystal silicon layer; and
    f) patterning the single crystal silicon layer such that the single crystal silicon layer is removed except for a part thereof covering a region of the oxide layer where the second type semiconductor device is to be provided, the patterning being performed to remove the silicon nitride film simultaneously with the removal of the silicon layer.

2. A method as claimed in claim 1, in which said step e) of annealing is performed by irradiation of an energy beam.

3. A method as claimed in claim 1, in which said step d) of depositing the silicon layer comprises a step of depositing a polysilicon layer as the silicon layer.

4. A method as claimed in claim 1, in which said step f) of patterning comprises a step of dry etching the silicon layer.

5. A method as claimed in claim 1, in which said step of dry etching is performed such that the removal of the single crystal phase silicon layer and the remove of the silicon nitride film are performed at substantially a same rate.

6. A method as claimed in claim 1, further comprising a step f) of forming a silicon oxide film on the substrate prior to said step b) of providing the silicon nitride film.

* * * * *

UNITED STATES PATENT AND TRADEMARK OFFICE
CERTIFICATE OF CORRECTION

PATENT NO. : 5,116,768
DATED : MAY 26, 1992
INVENTOR(S) : SEIICHIRO KAWAMURA

It is certified that error appears in the above-identified patent and that said Letters Patent is hereby corrected as shown below:

Col. 6, line 5, "lective" should be --lectively--;
line 49, "1," should be --4,--;
line 51, "remove" should be --removal--.

Signed and Sealed this

Third Day of August, 1993

Attest:

MICHAEL K. KIRK

Attesting Officer     Acting Commissioner of Patents and Trademarks